United States Patent
Haba et al.

(10) Patent No.: US 9,111,946 B2
(45) Date of Patent: Aug. 18, 2015

(54) METHOD OF THINNING A WAFER TO PROVIDE A RAISED PERIPHERAL EDGE

(71) Applicant: Invensas Corporation, San Jose, CA (US)

(72) Inventors: Belgacem Haba, Saratoga, CA (US); Ilyas Mohammed, Santa Clara, CA (US)

(73) Assignee: Invensas Corporation, San Jose, CA (US)

(*) Notice: Subject to any disclaimer, the term of this patent is extended or adjusted under 35 U.S.C. 154(b) by 19 days.

(21) Appl. No.: 13/722,340

(22) Filed: Dec. 20, 2012

(65) Prior Publication Data

US 2014/0179061 A1   Jun. 26, 2014

(51) Int. Cl.
| | |
|---|---|
| *H01L 21/00* | (2006.01) |
| *H01L 21/56* | (2006.01) |
| *H01L 21/50* | (2006.01) |
| *H01L 21/304* | (2006.01) |
| *H01L 21/78* | (2006.01) |
| *H01L 23/31* | (2006.01) |
| *H01L 25/065* | (2006.01) |
| *H01L 25/00* | (2006.01) |

(52) U.S. Cl.
CPC .............. *H01L 21/56* (2013.01); *H01L 21/304* (2013.01); *H01L 21/50* (2013.01); *H01L 21/78* (2013.01); *H01L 23/3107* (2013.01); *H01L 25/0657* (2013.01); *H01L 25/50* (2013.01); *H01L 2225/06513* (2013.01); *H01L 2225/06565* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2007/0218593 A1* | 9/2007 | Masuda .......................... 438/127 |
| 2008/0179730 A1* | 7/2008 | O'Donnell et al. ............ 257/690 |
| 2010/0233831 A1* | 9/2010 | Pohl et al. ......................... 438/15 |
| 2010/0248427 A1* | 9/2010 | Wu et al. ........................ 438/118 |
| 2012/0238058 A1* | 9/2012 | Luo et al. ....................... 438/111 |
| 2013/0084659 A1* | 4/2013 | Martens et al. .................. 438/14 |
| 2013/0210198 A1* | 8/2013 | Lin ................................ 438/126 |
| 2013/0295720 A1* | 11/2013 | Fuergut et al. ................ 438/107 |
| 2014/0110856 A1* | 4/2014 | Lin ................................ 257/774 |

* cited by examiner

*Primary Examiner* — Scott B Geyer
*Assistant Examiner* — Brigitte Paterson
(74) *Attorney, Agent, or Firm* — Lerner, David, Littenberg, Krumholz & Mentlik, LLP (57) ABSTRACT

A first area of a first surface of an encapsulated component can be thinned, the component including: a semiconductor chip having an active surface opposite the first surface, and an encapsulant extending outwardly from edges of the semiconductor chip. An entire area of the active surface may be aligned with the first area. After the abrading, a second area of the encapsulated component beyond the first area may have a thickness greater than a thickness of the first area. The second area can be configured to fully support the abraded encapsulated component in a state of the encapsulated component being manipulated by handling equipment.

15 Claims, 9 Drawing Sheets

METHOD OF THINNING A WAFER TO PROVIDE A RAISED PERIPHERAL EDGE

BACKGROUND OF THE INVENTION

1. Field of the Invention

The subject matter of the present application relates to methods of thinning microelectronic or semiconductor elements such as semiconductor chips and wafers and methods of handling such elements.

2. Description of the Related Art

Microelectronic elements such as semiconductor chips commonly are provided with elements which protect the microelectronic element and facilitate its connection to other elements of a larger circuit. For example, a semiconductor chip typically is provided as a small, flat element having oppositely facing front and rear surfaces and contacts at the front surface. The contacts are electrically connected to the numerous electronic circuit elements formed integrally within the chip. Such a chip commonly is provided in a package having a miniature circuit panel referred to as a substrate. The chip is typically mounted to the substrate with the front or rear surface overlying a surface of the substrate, and the substrate typically has terminals at a surface of the substrate. The terminals are electrically connected to the contacts of the chip. The package typically also includes some form of covering overlying the chip on the side of the chip opposite from the substrate. The covering serves to protect the chip and, in some cases, the connections between the chip and the conductive elements of the substrate. Such a packaged chip can be mounted to a circuit panel such as a circuit board by connecting the terminals of the substrate to conductive elements such as contact pads on the larger circuit panel.

In some applications, it is desirable to form vertically stacked assemblies of microelectronic elements such as semiconductor chips. Such assemblies can be formed at wafer-level by stacking and electrically interconnecting two or more semiconductor wafers atop one another and then severing the semiconductor wafers into individual stacked assemblies each containing two or more corresponding stacked electrically interconnected semiconductor chips. A stacked assembly incorporating plural semiconductor chips saves space because it requires roughly the same amount of area of a circuit panel as an individual semiconductor chip of the stacked assembly. Such assembly may also achieve greater performance per cost and area requirements due to reduced interconnection lengths between semiconductor chips within the stacked assembly.

Often the thickness of a semiconductor wafer is reduced prior to assembling the semiconductor wafer with other semiconductor wafers such that the stacked assembly of semiconductor wafers has a smaller thickness than if the semiconductor wafers had not been processed in this way. Reducing the thickness of each semiconductor wafer also permits the vertical interconnects of each wafer to extend only partly through the original thickness of the semiconductor wafer, lowering the cost of forming the vertical interconnects.

Despite the considerable effort devoted in the art to development of methods of stacking and processing semiconductor wafers, further improvement would be desirable.

BRIEF SUMMARY OF THE INVENTION

According to an aspect of the invention, a method is provided for thinning an encapsulated component such as a semiconductor chip, plurality of semiconductor chips, or a semiconductor wafer. Such method can include abrading a first area of a first surface of an encapsulated component to reduce a thickness of the encapsulated component within the first area. The encapsulated component may include a semiconductor chip having an active surface extending in a first direction and a second direction transverse to the first direction, wherein the active surface faces in a direction opposite from that of the first surface. The semiconductor chip may have a plurality of contacts at the active surface and a plurality of edges extending away from the active surface towards the first surface. An encapsulant can extend outwardly in the first and second directions from the edges of the semiconductor chip, and an entire area of the active surface may be aligned with the first area in the first and second directions. The abrading can be performed such that after the abrading, a second area of the encapsulated component beyond the first area has a thickness greater than the reduced thickness. The second area can be configured to fully support the abraded encapsulated component in a state in which the encapsulated component is manipulated by handling equipment.

In accordance with one or more examples, the semiconductor chip may include a plurality of semiconductor chips, the plurality of semiconductor chips being joined with one another at peripheral edges of the respective semiconductor chips. Active surfaces of the semiconductor chips can be disposed in a common plane, and entire areas of the active surfaces of all the semiconductor chips can be aligned with the first area in the first and second directions.

In accordance with one or more examples, the plurality of semiconductor chips may be integral portions of a semiconductor component having a semiconductor region extending continuously within the plurality of semiconductor chips.

In accordance with one or more examples, at least a substantial portion of the active surface may be not in contact with the encapsulant.

In accordance with one or more examples, the semiconductor component may be a semiconductor wafer, and the encapsulated component may further include sacrificial structure overlying at least the substantial portion of the common active surface.

In accordance with one or more examples, the method may further include forming the encapsulant by molding a dielectric material onto the semiconductor wafer in a state in which the sacrificial structure overlies the common active surface, wherein the sacrificial structure provides mechanical support to the plurality of semiconductor chips during the abrading.

In accordance with one or more examples, the sacrificial structure may overlie the substantial portion of the common active surface and the encapsulant may contact a peripheral portion of the common active surface.

In accordance with one or more examples, the peripheral portion of the common active surface in contact with the encapsulant can extend inwardly from an edge of the semiconductor wafer to a distance of at least 1.0 millimeters from the edge of the semiconductor wafer.

In accordance with one or more examples, the peripheral portion of the common active surface in contact with the encapsulant can extend from an edge of the sacrificial structure.

In accordance with one or more examples, the reduced thickness of the abraded encapsulated component may be at least as great as a sum of the thickness of the semiconductor wafer after the abrading plus a thickness of the sacrificial structure overlying the semiconductor wafer.

In accordance with one or more examples, the second area of the encapsulated component may be a continuous area surrounding the first area in the first and second directions.

In accordance with one or more examples, the second area of the encapsulated component may be discontinuous within an area of the encapsulated component surrounding the first area in the first and second directions.

In accordance with one or more examples, the encapsulated component further can comprise a support component, the encapsulant mechanically coupling the support component with the plurality of semiconductor chips.

In accordance with one or more examples, the support component may be continuous and may surround the first area in the first and second directions.

In accordance with one or more examples, the support component may be discontinuous within an area surrounding the first area in the first and second directions.

In accordance with one or more examples, the support component may comprise a solid metal.

In accordance with one or more examples, the method may further include, prior to the abrading of the encapsulated component, forming the encapsulated component by forming the sacrificial structure overlying the common active surface and then depositing the encapsulant over the edge and over at least a portion of a non-active surface of the semiconductor wafer opposite from the common active surface. The sacrificial structure may protect the common active surface from contact with the encapsulant.

In accordance with one or more examples, the method may further include, removing at least a portion of the sacrificial structure after the abrading.

In accordance with one or more examples, the encapsulated component may include a plurality of semiconductor wafers, the plurality of semiconductor chips being portions of the semiconductor wafers.

In accordance with one or more examples, at least one peripheral edge of each of the semiconductor chips may be attached by dielectric material to at least one peripheral edge of another semiconductor chip separated from such semiconductor chip in at least one of the first or second directions.

In accordance with one or more examples, the plurality of semiconductor chips may be bound together at respective positions of a panel comprising the plurality of semiconductor chips and the dielectric material.

According to another aspect of the invention, a method is provided which includes manipulating at least one of first and second encapsulated components so as to assemble the first and second encapsulated components to form an assembly in which surfaces of the first and second encapsulated components may be juxtaposed with one another. Each of the first and second encapsulated components may include a plurality of semiconductor chips each having an active surface disposed in a common plane defining a common active surface, and each of the semiconductor chips may have a plurality of contacts at its respective active surface. An encapsulant may extend outwardly from the semiconductor chips in directions parallel to the common active surface. A first area of each encapsulated component which may encompass entire areas of the plurality of semiconductor chips of the respective encapsulated component has a reduced thickness, wherein a second area of each encapsulated component disposed beyond the first area has a thickness greater than the reduced thickness. The second area may fully support the encapsulated component during the manipulating.

The method may further include processing the assembly to remove at least the second area of each encapsulated component such that the processed assembly may have a thickness less than the sum of: the thicknesses of the encapsulated components within the respective second areas and the distance between the juxtaposed surfaces of the encapsulated components.

In accordance with one or more examples, the processed assembly may have a thickness less than or equal to the sum of: the reduced thicknesses of the first areas of the encapsulated components and the distance between the juxtaposed surfaces of the encapsulated components.

In accordance with one or more examples, the assembling of the encapsulated components may include electrically interconnecting conductive elements of each of the first and second encapsulated components with one another.

In accordance with one or more examples, the conductive elements of at least one of the first or second encapsulated components may include interconnects disposed in the first area and which extend in a direction of the thickness of such encapsulated component. The assembling may electrically connect the interconnects of the at least one encapsulated component with the conductive elements of another of the first or second encapsulated components.

In accordance with one or more examples, the manipulating may be performed such that the juxtaposed surfaces may be common active surfaces of the encapsulated components.

In accordance with one or more examples, the manipulating may be performed such that the juxtaposed surfaces may be non-active surfaces opposite from common active surfaces of each of the encapsulated components.

In accordance with one or more examples, the manipulating may be performed such that one of the juxtaposed surfaces may be a common active surface of one of the first and second encapsulated components and one of the juxtaposed surfaces may be a non-active surface of one of the first and second encapsulated components.

In accordance with one or more examples, at least one of the first or second encapsulated components may include an alignment surface disposed in the second area thereof. In such example, the manipulating may be performed such that the alignment surface of the at least one encapsulated component aligns the at least one encapsulated component relative to at least one other of the encapsulated components.

In accordance with one or more examples, the method may include severing the assembly into a plurality of individual stacked assemblies, each stacked assembly can include a first semiconductor chip severed from the first encapsulated component and a second semiconductor chip severed from the second encapsulated component, the second semiconductor chip stacked atop the first semiconductor chip.

DETAILED DESCRIPTION OF THE INVENTION

Accordingly, with reference to FIG. 1, a wafer component 100 in an initial stage of processing can be a wafer having a first surface 102 facing downward in the figure, a second surface 104 of the wafer facing in an opposite direction. A wafer typically is a flat generally disk-shaped object which includes a region consisting essentially of semiconductor material having a diameter of a few hundred millimeters and a thickness 110 of a few hundred microns extending between the first surface 102 and the second surface 104 in a direction 112 normal to the first surface 102. A dielectric region may overlie either or both of the first or second surfaces and may in some cases be exposed at either or both of the first or second surfaces. An edge region 108 of the wafer is illustrated in FIG. 1A, which typically is radiused or chamfered at the first and second surfaces 102, 104. The edge 118 of the semiconductor wafer is defined as a location of the wafer at which the wafer extends to a greatest distance from an axis 101 extending in direction 112 through the center of the wafer. The edge 118 of the wafer 100 may define a generally circular path at a generally constant radius from a central axis 101 of the wafer. A notch or a straight segment can be formed in the edge region which can be used for aligning the wafer relative to a fixture, other component, or handling equipment when processing the wafer.

Figure 1A:
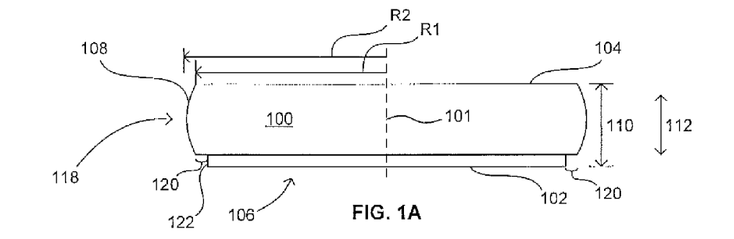
FIG. 1A is a sectional view illustrating a structure of a semiconductor wafer.

In one example, the wafer component can be a semiconductor device wafer in which the first surface is an active surface 102 of the wafer, wherein a plurality of active or passive circuit elements, e.g., transistors, diodes, capacitors, inductors, resistors, etc., or both active and passive circuit elements may be provided in a semiconductor device region 106 of the wafer adjacent to the active surface. In such case, the second surface 104 can be referred to as a "non-active" surface. In another example, the semiconductor wafer may not incorporate circuit elements. Conductive elements such as contacts, e.g., conductive pads, posts, and traces may be provided at such first surface 102. As used in this disclosure with reference to a component such as a substrate, wafer, microelectronic element, circuit panel or other similar object having a surface and conductive elements, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

When the wafer is a device wafer, some or all of the conductive elements at the active surface 102 may be electrically interconnected with the circuit elements through wiring provided in the dielectric region overlying the semiconductor region. In one example, some of the conductive elements may not be electrically interconnected with the circuit elements. As further shown in FIG. 1A, the semiconductor device region 106 can extend to within a few millimeters of the edge 118. A peripheral portion 120 of the active surface of the wafer occupies a disk-shaped area of the wafer extending between the edge 118 of the wafer and an edge 122 of the semiconductor device region 106 adjacent thereto. As used herein, a "peripheral region" of a surface of a semiconductor wafer or other component means a region of the surface less than an entire area of the surface which extends from a peripheral edge of the wafer or component inwardly towards a central axis or centroid of the wafer or component. In the example shown in FIG. 1A, the peripheral region can be a disk-shaped area extending over a range of radii from the central axis 101 between the radius R2 at the edge 118 of the wafer to the radius R1 at the edge 122 of the semiconductor device region. In one example, the peripheral region extends over a range of radii R1 to R2 which typically is greater than 1.0 millimeters and may in fact be several millimeters.

Figure 1B:
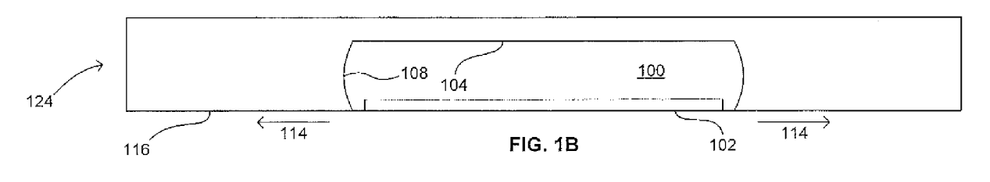
FIG. 1B is a sectional view illustrating a stage in fabrication of an encapsulated wafer component according to an embodiment of the invention.

In a stage of processing shown in FIG. 1B, an encapsulated component, such as an encapsulated wafer component 124 is formed which includes an encapsulant 116 overlying the edge region 108 of the wafer and extending outwardly from the edge 118. The encapsulant typically extends outwardly from the edge 118 in all directions 114 perpendicular or at least generally perpendicular to the direction 112. In the example illustrated in FIG. 1B, the encapsulant may overlie and contact the second surface 104 of the wafer. However, in another example as illustrated in FIG. 1C, the encapsulant of the encapsulated wafer component 126 may not cover the second surface 104 and may instead only overlie the edge region 108 of the wafer.

Figure 1C:
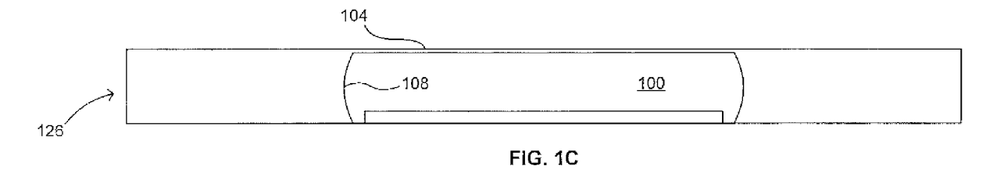
FIG. 1C is a sectional view illustrating a stage subsequent to the stage of FIG. 1B in fabrication of an encapsulated wafer component according to an embodiment of the invention.

As further shown in FIGS. 1B and 1C, the encapsulant 116 can be formed in such way that the first surface 102 or active surface of the wafer 100 is free of the encapsulant. For example, the encapsulant can be formed by placing the wafer 100 first surface 102 down onto a first mold plate and flowing an encapsulant within a cavity enclosing the wafer 100 therein so as to form the encapsulated wafer 124 (FIG. 1B) or encapsulated wafer 126 (FIG. 1C). The encapsulant may include a material which has substantial rigidity but which typically is less rigid than the material of the wafer 100. The encapsulant may include one or more polymeric materials which can include one or more of epoxies, thermoset or thermoplastic materials, which can in some cases include a filler or loading material for additional mechanical reinforcement such as glass or ceramic particles or rods, for example. In a particular embodiment, the encapsulant 116 may have a coefficient of thermal expansion of 10 parts per million per degree Celsius (hereinafter "ppm/° C.") or less. Such "low CTE" encapsulant when provided in an encapsulated wafer as seen in FIG. 1B or 1C, can apply a moderate tensile force to the wafer at the edge thereof which may improve planarity of the encapsulated wafer component 124, 126 at least one of before, during or after further processing such as an abrading process as described below.

Figure 1D:
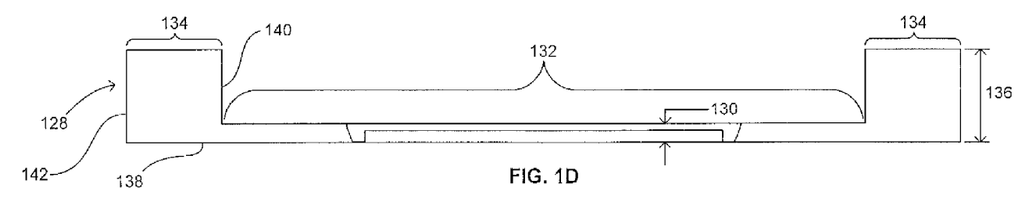
FIG. 1D is a sectional view illustrating a stage subsequent to the stage of FIG. 1C in fabrication of an encapsulated wafer component according to an embodiment of the invention.

FIG. 1D illustrates a stage of fabrication after a thickness of a first area of the encapsulated wafer component has been reduced by an abrading process such as one or more of grinding, lapping or polishing applied to the encapsulated wafer component 124. The first area is a substantial portion of the area of the encapsulated wafer component 124 and the abrading process results in a generally uniform removal of material throughout the first area to which it is applied. Thus, in the example seen in FIG. 1D, the thickness of not only the wafer 100 has been reduced to a reduced thickness 130, but the thickness of the encapsulant within the first area beyond the edge 108 of the wafer has been reduced to the first thickness. However, as seen in FIG. 1D, after the abrading process, a second area 134 extending beyond the first area of the encapsulated wafer component has a thickness 136 which is greater than the reduced thickness. The greater thickness 136 can be a "supporting thickness" of the encapsulated wafer 128 in the second area which can help structurally support the first area 132 of the encapsulated wafer in a state in which the encapsulated wafer component 128 is manipulated by equipment applying a force to the second area thereof. For example, the second area 134 of the encapsulated wafer component 128 having the greater thickness may fully support the encapsulated wafer component 128 during handling of encapsulated wafer component 128. For example, the second area 134 may fully support the encapsulated wafer component 128 during handling such as in a state in which a robotic manipulator grasps opposite surfaces 138, 140 of the second area 134 between fingers thereof and lifts or otherwise repositions the encapsulated wafer component 128 from one position to another position. In one example, the encapsulated wafer component 128 may undergo further processing such as processing which bonds the encapsulated wafer component with another such encapsulated wafer component as further described below with reference to FIGS. 10A, 10B and 10C, or further processing such as processing which severs a stacked assembly of two or more such encapsulated wafer components into a plurality of individual stacked assemblies, each individual stacked assembly including two or more portions of each wafer, e.g., semiconductor chips, of each wafer which are stacked and electrically connected with one another.

In such subsequent handling and processing, the greater thickness of the second area 134 of the encapsulated wafer component 128 mechanically reinforces the wafer 100 during handling subsequent to the abrading process, such that the greater thickness 134 may permit the thickness of the first area to be reduced to a smaller reduced thickness 130 than if there had been no second area 134 having the greater thickness. Alternatively, or in addition thereto, the greater thickness 134 of the second area can help protect the first area of the encapsulated wafer component 128 from damage during subsequent handling such as manipulation of the encapsulated wafer component by a robotic arm.

Figure 2:
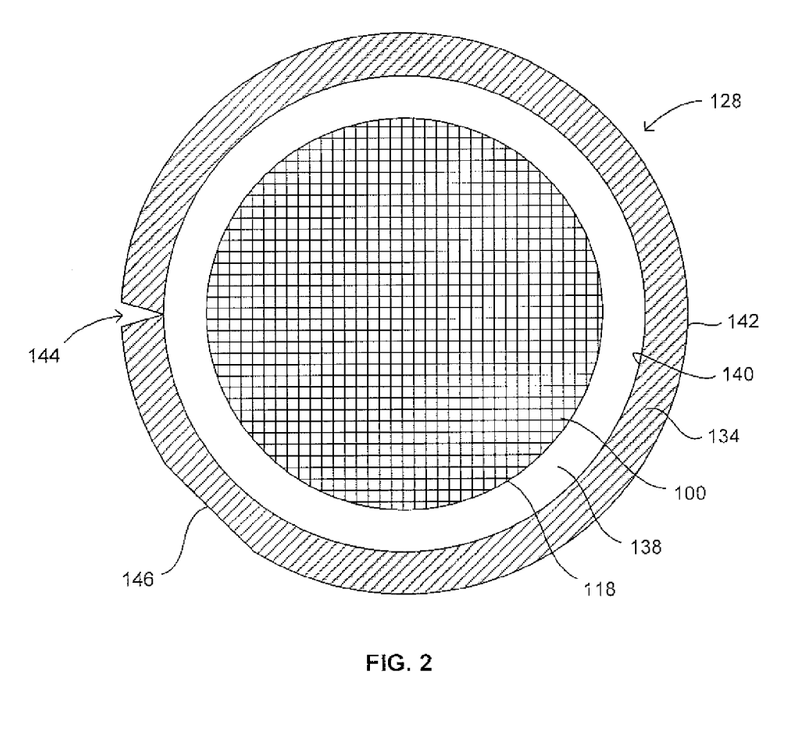
FIG. 2 is a plan view illustrating an encapsulated wafer formed by fabrication in accordance with an embodiment of the invention.

As further seen in the plan view provided in FIG. 2, the first area of the encapsulated wafer component 128 having the reduced thickness is depicted by the central portion thereof occupied by the wafer 100 and the portion of the encapsulant extending outwardly from the edge 118 of the wafer which has the same reduced thickness. A second area 134 of the encapsulated wafer component extends outwardly from an edge 140 of the first area to an outer edge 142 of the encapsulated wafer component. Optional alignment features such as, for example, a notch 144 in the outer edge 142, or a flat segment 146 of the outer edge can also be seen in FIG. 2. Such an optional alignment feature may be used to help align the encapsulated wafer component 128 or maintain alignment of the encapsulated wafer component 128 relative to a fixture or another component, e.g., another wafer in a subsequent stage of handling or processing. FIG. 2 further depicts a plurality of undiced microelectronic elements 103, e.g., semiconductor chips, which may or may not include additional circuit layers thereon, which remain integral portions of the semiconductor wafer at this stage of processing.

Figure 3:
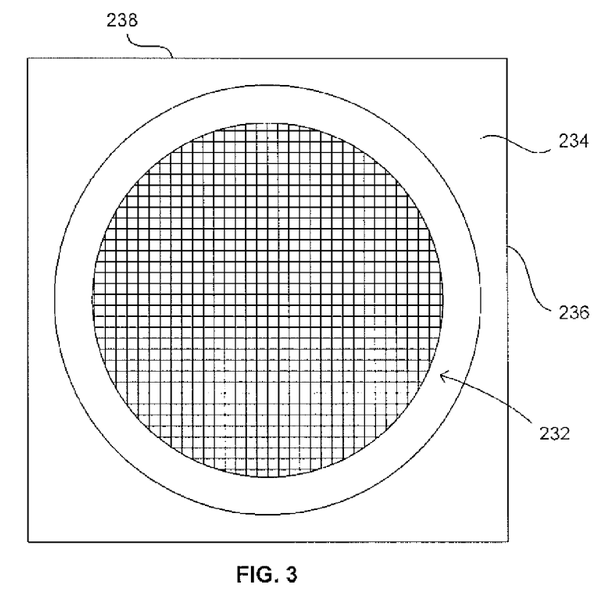
FIG. 3 is a plan view illustrating an encapsulated wafer in accordance with a variation of the embodiment of the invention shown in FIG. 2.

FIG. 3 is a plan view illustrating an encapsulated component such as an encapsulated wafer component 228 according to a variation of the embodiment shown and described above relative to FIGS. 1D and 2, in which the second area 234 of the encapsulated wafer component has a plurality of straight outer edges 236, 238, each of which may extend in a single straight direction. For example, as seen in FIG. 3, some of the outer edges 236 may be perpendicular to other outer edges 238 so that the outer edges 236, 238 define a rectangle, square or other polygon which surrounds the edge 218 of a disk-shaped first area 232 of the encapsulated wafer component 228. Such polygonal encapsulated wafer component 228 may in some cases assist in further processes which utilize some or all of the straight outer edges 236, 238 in aligning the encapsulated wafer component in a predetermined orientation relative to a fixture, other encapsulated wafer component or other component.

Figure 4:
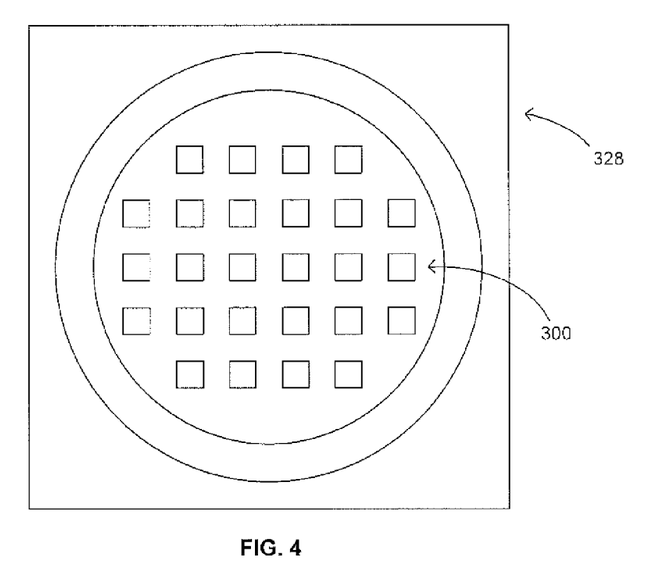
FIG. 4 is a plan view illustrating an encapsulated wafer in accordance with another variation of the embodiment of the invention shown in FIG. 2.

FIG. 4 is a plan illustrating an encapsulated component such as an encapsulated wafer component 328 according to a variation of the embodiment shown in FIG. 3 in which the wafer 300 has a different structure from the wafer 100 in the embodiments shown and described above. In this case, the wafer 300 may be in form of a reconstituted wafer which includes a plurality of individual microelectronic elements such as semiconductor chips which have been previously severed from one another in a dicing process performed prior thereto. The microelectronic elements can be bound together in the reconstituted wafer by an insulating material which adheres to and binds adjacent edges of the microelectronic elements to one another.

In a further variation, a reconstituted wafer 300 can be provided instead of the wafer 100 in the encapsulated wafer shown and described above relative to FIG. 2. Moreover, such reconstituted wafer can be provided in the alternative to any of the wafers incorporated in the embodiments of the invention further described herein.

Figure 5A:
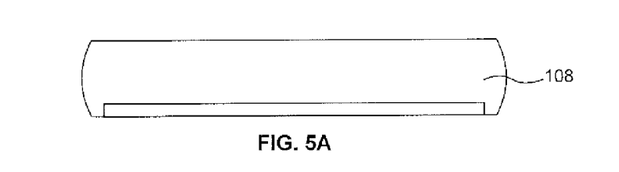
FIG. 5A is a sectional view illustrating a structure of a semiconductor wafer.
Figure 5B:
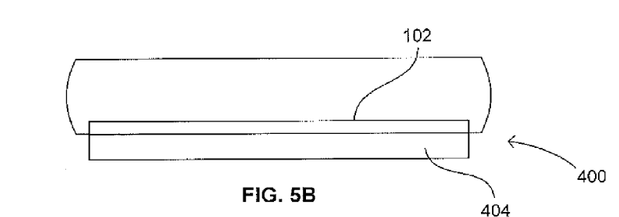
FIG. 5B is a sectional view illustrating a stage in fabrication of an encapsulated wafer component according to an embodiment of the invention.

FIGS. 5A-5D illustrate stages in processing of an encapsulated component, e.g., encapsulated wafer component according to a further embodiment of the invention. Referring to FIGS. 5A and 5B, a wafer component 400 can include a semiconductor wafer 100 as shown and described above relative to FIG. 1A, with additional sacrificial structure 404 overlying the first surface 102 of the wafer. Typically, the sacrificial structure includes one or more layers of material which may protect the first surface 102 of the wafer from contact with an encapsulant 416 (FIG. 5C) which overlies at least the edge region 408 of the wafer component. The sacrificial structure can also serve to permit the thickness of the encapsulant 438 in the first area of the encapsulated wafer to be reduced to a thickness 440 which is greater than the final thickness 442 of the semiconductor wafer therein.

Figure 5C:
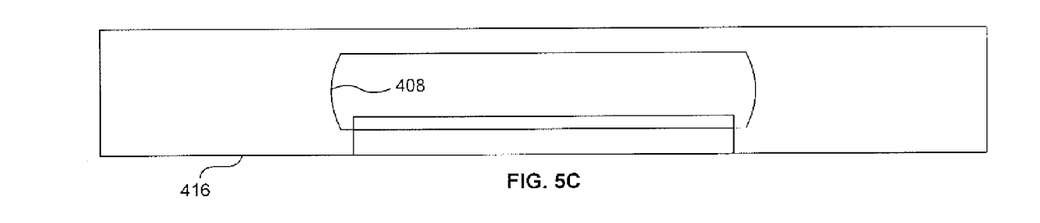
FIG. 5C is a sectional view illustrating a stage subsequent to the stage of FIG. 5B in fabrication of an encapsulated wafer component according to an embodiment of the invention.
Figure 5D:
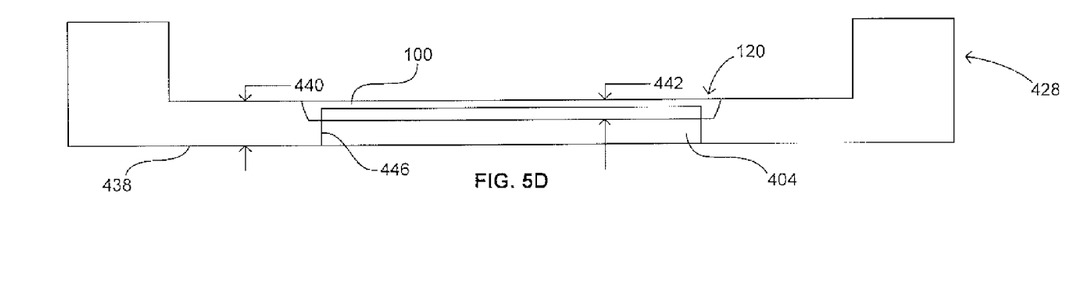
FIG. 5D is a sectional view illustrating a stage subsequent to the stage of FIG. 5C in fabrication of an encapsulated wafer component according to an embodiment of the invention.

The greater thickness 440 of the encapsulant in the first area in this embodiment can improve one or more of the mechanical strength or rigidity of the encapsulant therein, thereby providing an encapsulated wafer component which can be handled more readily or may permit the semiconductor wafer therein to be thinned to a greater degree than would otherwise be possible.

At a later stage of processing subsequent to that shown in FIG. 5D, the sacrificial structure 404 can be removed, at which time the first surface 102 of the wafer becomes exposed and the wafer then becomes available for further assembly with another article or wafer, such as which may also be incorporated in another encapsulated wafer component.

As further illustrated in FIG. 5D, the presence of the sacrificial structure 404 overlying a portion of the first surface 102 or active surface of the wafer 100 can assist in the formation of an encapsulant which overlies at least a portion of the peripheral region 120 of the first surface 102 or active surface as described above relative to FIG. 1A. In such case, the encapsulant 438 may extend from an edge 446 of the sacrificial structure.

Figure 6:
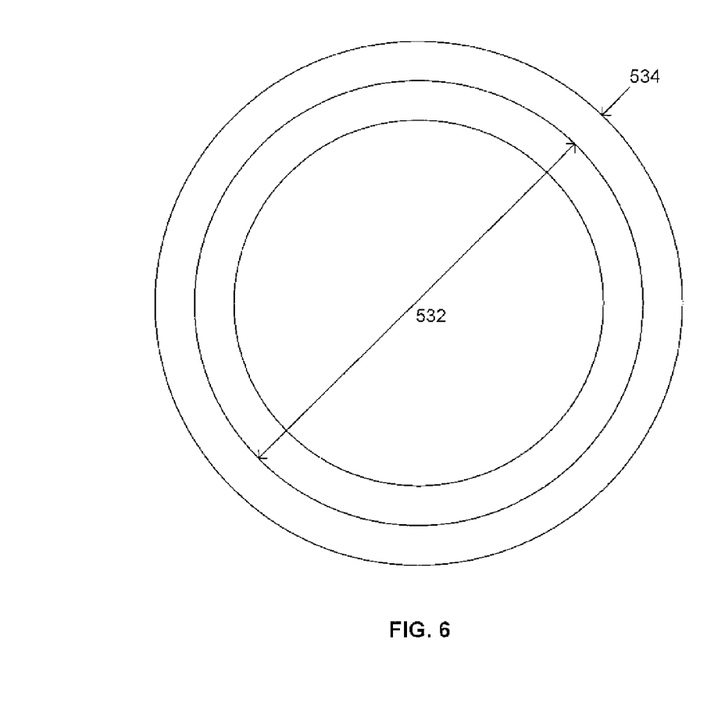
FIG. 6 is a plan view illustrating a structure of an encapsulated wafer component according to an embodiment of the invention.

As further shown in FIG. 6, the second area having a greater thickness in an encapsulated wafer component according to the various embodiments described herein may be a continuous area 534, e.g., disk-shaped area, which surrounds the first area 532 of the encapsulated wafer component.

Figure 7:
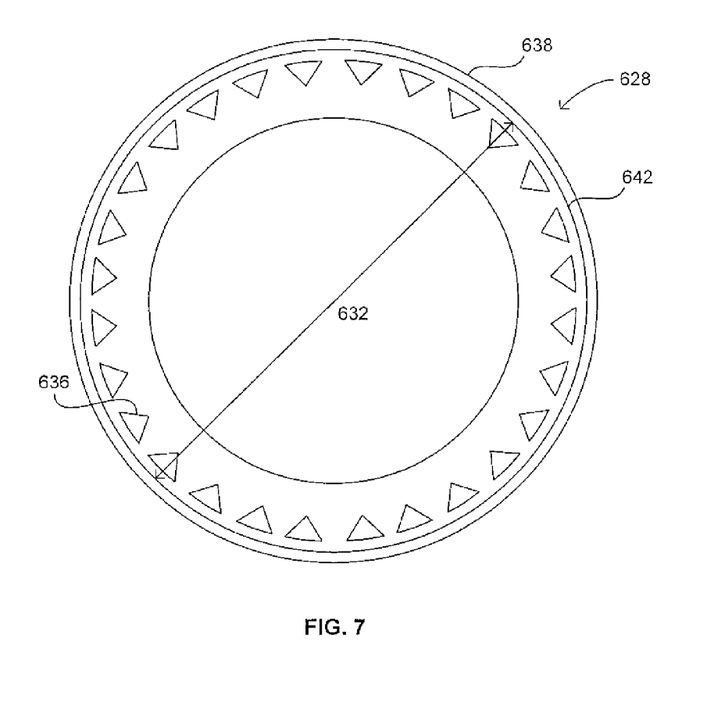
FIG. 7 is a plan view illustrating a structure of an encapsulated wafer component according to an embodiment of the invention.

Alternatively, as seen in FIG. 7, the second area 634 may be discontinuous, such as may comprise a plurality of features 636 which extend in a direction away from, e.g., normal to, a surface of the reduced thickness first area of the encapsulated wafer. As further shown in FIG. 7 the encapsulated wafer may include a vertically rising ring 638 at an edge thereof. In a particular embodiment, the discontinuous features 636 may serve to mechanically support and reinforce the reduced thickness encapsulated wafer component 628 while permitting certain subsequent handling or fabricating processes such as spin-coating to proceed unimpeded by the reinforcement features 636, since liquids may easily flow around the reinforcement features 636 during spin-coating. In a spin-coating process, the ring may further serve as a dam which can prevent liquids from flowing past the ring 638 and off the outer edge 642 of the encapsulated wafer component 628.

Figures 8, 9:
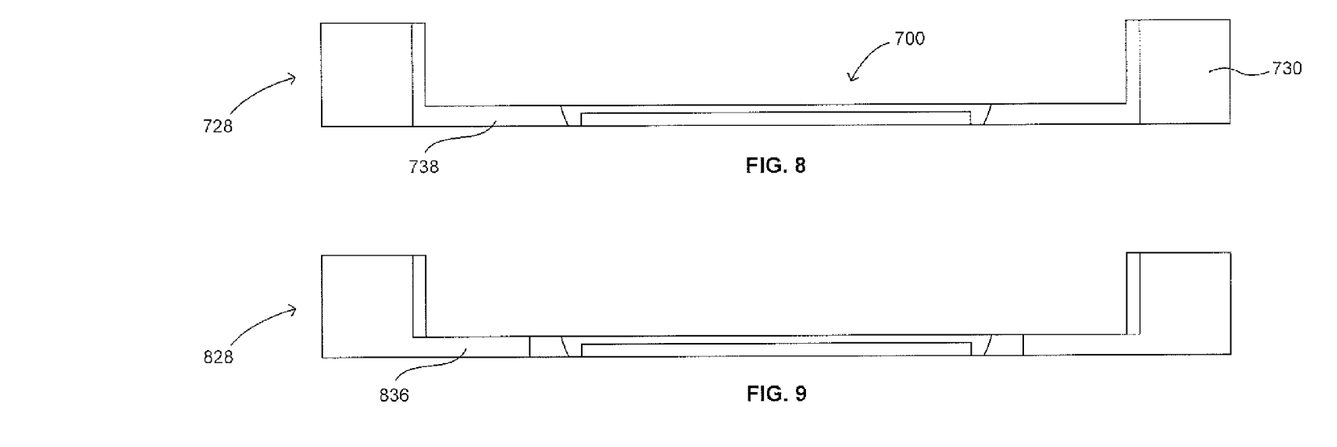
FIG. 8 is a sectional view illustrating an encapsulated wafer component according to an embodiment of the invention.
FIG. 9 is a sectional view illustrating an encapsulated wafer component according to an embodiment of the invention.

FIG. 8 illustrates an embodiment according to a variation of the embodiment illustrated in FIGS. 1D and 2, or the embodiment illustrated in FIG. 5D, in which the encapsulated component which may be an encapsulated wafer component 728 can further include a support component 730 which may be a solid metal component or component of other material having improved strength or rigidity, for example, which is contacted by the encapsulant, and which may thus be mechanically coupled with the wafer component 700 by the encapsulant. In the example illustrated in FIG. 8, the support component 730 can be a ring-like or frame structure which surrounds the reduced thickness first area of the encapsulated wafer component 728.

Alternatively, in the further variation shown in FIG. 9, the support component may have a portion 836 which extends into the first area of the encapsulated wafer component 828. In a particular example, the support component may function as a process stop structure, such that during the abrading process which reduces the thickness of the encapsulated wafer component's first area, the abrading process may be stopped or may stop automatically when surface 840 of the support component is reached.

In a particular example, the support component may have a discontinuous structure which may include discrete features such as vertically extending pillars similar to the second area of the encapsulated wafer shown in FIG. 7 or may include laterally extending fingers or a mesh which may allow penetration thereof by the encapsulant. The support component may have circular, rectangular, e.g., square or even polygonal shape, among others.

Figure 10:
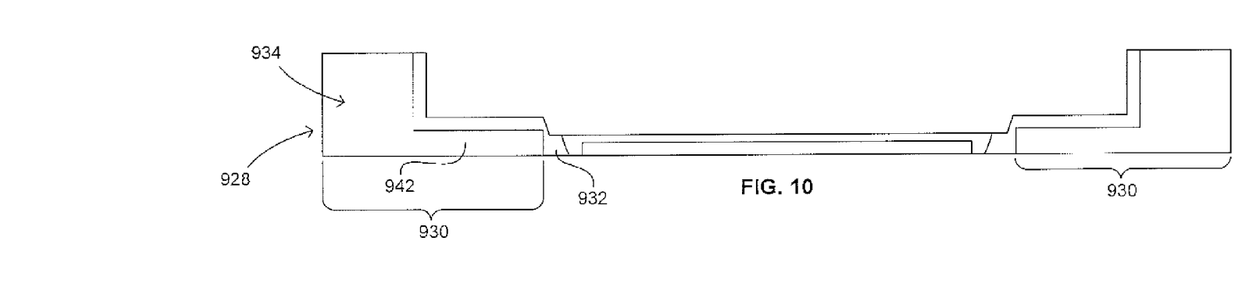
FIG. 10 is a sectional view illustrating an encapsulated wafer component according to an embodiment of the invention.

FIG. 10 illustrates an encapsulated wafer component 928 according to a further variation in which both a first area 932 and another area 942 of the encapsulated wafer component have reduced thickness relative to a second area 934 of the encapsulated wafer. Due to increased surface area of the encapsulant in contact with the wafer 700 and the support component 930, the encapsulated wafer component 928 of FIG. 10 may have improved mechanical coupling between the wafer or wafer component 900 therein and the support component.

In variations of the structures seen in FIGS. 8, 9 and 10, the support component may be continuous or discontinuous such as shown and described above with respect to FIGS. 6 and 7.

Figure 11A:
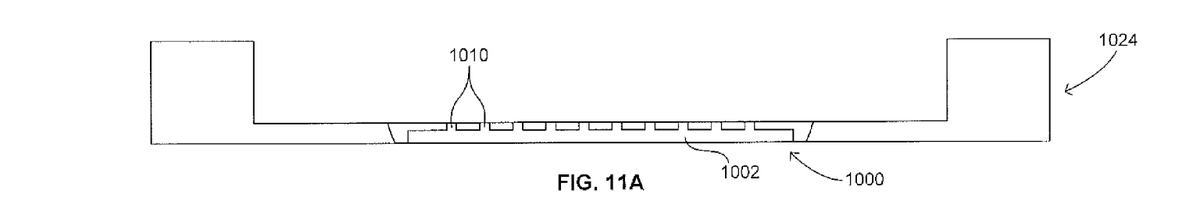
FIG. 11A is a sectional view illustrating an encapsulated wafer component according to an embodiment of the invention.
Figure 11B:
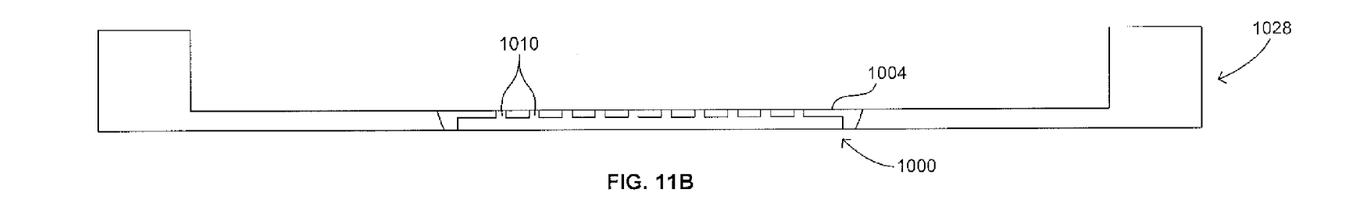
FIG. 11B is a sectional view illustrating an encapsulated wafer component according to an embodiment of the invention.
Figure 11C:
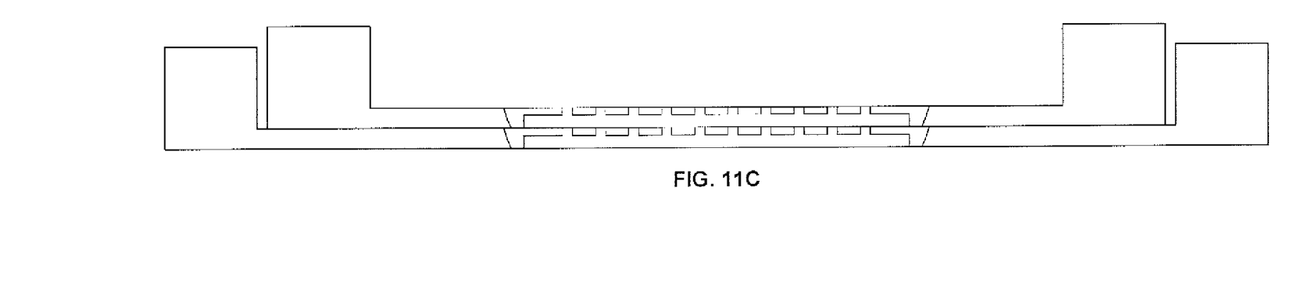
FIG. 11C is a sectional view illustrating a stacked wafer assembly of encapsulated wafer components formed according to an embodiment of the invention.

FIGS. 11A, 11B and 11C illustrate a method of forming a stacked wafer assembly by assembling a plurality of encapsulated wafer components 1024, 1028, each being in accordance with one or more of the examples described above. In the particular example seen in FIGS. 11A-11C, two wafers 1000 of like size and like conductive features thereon, e.g., which may include interconnects 1010 extending in a direction of a thickness of the wafer 1000, are supported within respective encapsulated wafer components 1024, 1028. In the examples illustrated in FIGS. 11A and 11B, the conductive interconnects 1010 may initially extend only partly through thicknesses of the original wafers 1000. The abrading process may then reduce the thicknesses of the wafers 1000 to an extent in which the interconnects 1010 can either be exposed directly as a result of the abrading or in which the interconnects can easily become exposed through a subsequent reveal step, such as may include a timed etch applied to the second surfaces 1004 of the reduced thickness encapsulated wafers 1024, 1028.

The dimensions and outer edges 1044 of one of the encapsulated wafer components can be sized to fit within the first area of another encapsulated wafer component 1028 of the two. Alternatively, the outer edges 104 of a first encapsulated wafer component 1024 may be dimensioned so as to permit self-alignment or otherwise facilitate alignment with features of the second encapsulated wafer component 1028. FIG. 10C schematically illustrates the first and second encapsulated wafer components aligned with one another in accordance with this procedure.

FIGS. 11A-11C illustrate a process in which a first surface 1002 or active surface of a first encapsulated wafer component 1024 is juxtaposed with a second surface 1004 or non-active surface of a second encapsulated wafer component 1028.

Figure 12:
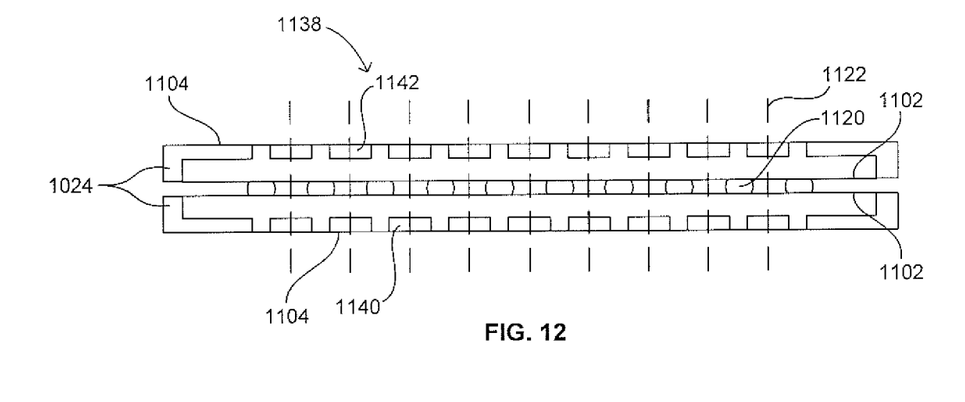
FIG. 12 is a sectional view illustrating a stacked wafer assembly formed according to an embodiment of the invention.

As part of the assembling process, electrically conductive elements at surfaces of the first and second encapsulated wafer components can be electrically interconnected with one another, such as through conductive masses of a bond metal or other bond material, such as seen for example, in FIG. 12.

Figure 13:
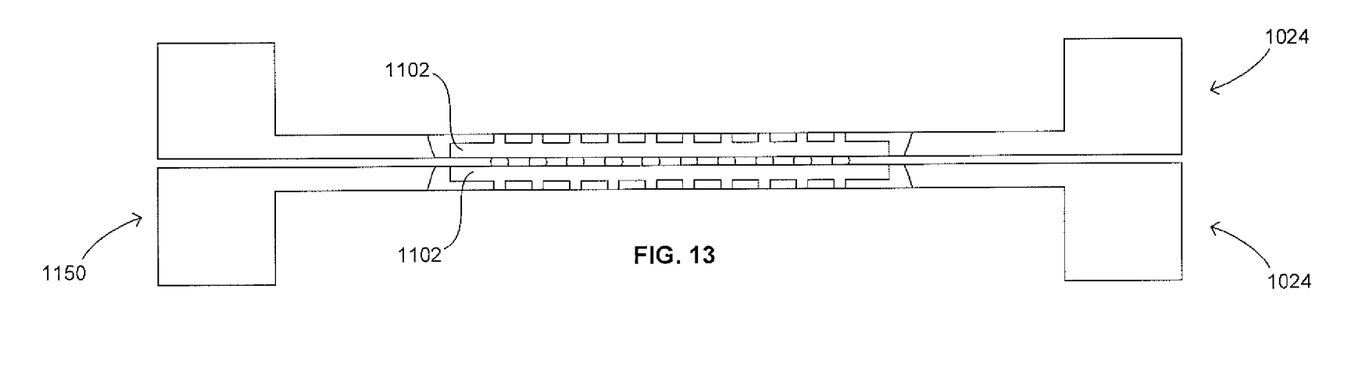
FIG. 13 is a sectional view illustrating a stacked wafer assembly of encapsulated wafer components formed according to an embodiment of the invention.

FIG. 13 illustrates an alternative assembling process according to a variation of the embodiment shown and described relative to FIGS. 11A-C in which first surfaces 1102 or active surfaces of each of two wafers 1024 are juxtaposed with one another and electrically interconnected with one another. In one example as illustrated in FIG. 12, conductive elements such as pads, posts, or other conductive structure at the juxtaposed surfaces 1102 can be joined with one another through heating and reflowing of a bond metal or other joining material or process which may include diffusion bonding, curing of a conductive paste or conductive matrix material, among others.

It is apparent that when two encapsulated wafer components having a sacrificial structure thereon as illustrated in FIG. 5D are assembled together in accordance with the assembly processes depicted in FIGS. 11A-C or FIG. 13, the assembly of the first and second encapsulated wafers has a thickness less than or equal to the sum of the reduced thickness of the first areas of the encapsulated wafers and the distance between the juxtaposed surfaces, e.g., juxtaposed first and second surfaces 1002, 1004 (FIG. 11C) or juxtaposed first surfaces 1102 (FIG. 13).

After assembling and electrically interconnecting the wafers of each encapsulated wafer component with one another to form a stacked wafer assembly 1150 as seen in FIG. 13, the second areas of the encapsulated wafer components can be removed therefrom such that the stacked wafer assembly 1152 illustrated in FIG. 12 results.

Such stacked wafer assembly 1152 can then be further severed, e.g., diced by sawing along saw lanes 1122, for example, to produce a plurality of individual stacked assemblies 1138 of a first semiconductor chip 1140 from a first encapsulated wafer component 1024 thereof, and a second semiconductor chip 1142 from a second encapsulated wafer component 1024 which overlies the first semiconductor chip 1140. As further seen in FIG. 12, each individual stacked assembly 1138 may include conductive interconnects at second or non-active surfaces 1104 thereof which can be further interconnected with other components which in one example, may include additional stacked assemblies 1138 of semiconductor chips.

In yet another example, prior to dicing the stacked wafer assembly, the stacked wafer assembly 1152 can be assembled with one or more further stacked wafer assemblies for form a larger stacked wafer assembly having an even greater number of vertically stacked wafers therein.

Figure 14:
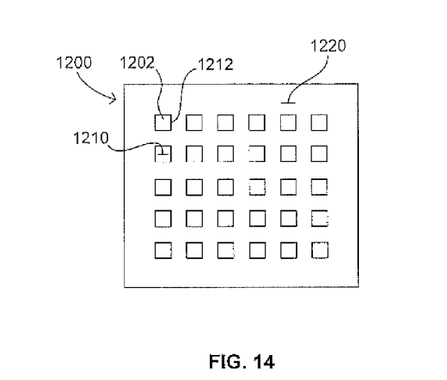
FIG. 14 is a plan view illustrating an encapsulated component usable in a method in accordance with a variation of the embodiment of the invention illustrated with respect to FIGS. 1A-C.

Referring to FIG. 14, in a variation of any and all of the embodiments shown and described above, instead of a wafer or reconstituted wafer, the encapsulated component can be in form of a panel 1200 of semiconductor chips 1202 each having an active surface 1210 disposed in a common plane defining a common active surface of the encapsulated component. In such panel, just as in the above-described reconstituted wafer 300 (FIG. 4), at least one peripheral edge of each semiconductor chip is bound to at least one other peripheral edge of another semiconductor chip adjacent thereto by dielectric material.

Figure 15:
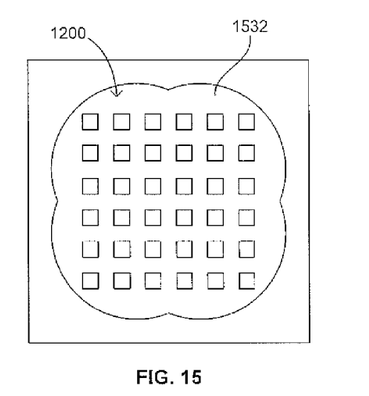
FIG. 15 is a plan view illustrating an encapsulated component, after removal of material therefrom in a method in accordance with a variation of the embodiment of the invention illustrated with respect to FIGS. 1A-C.

In such variation, the abrading of the encapsulated component 1200 can be performed with an apparatus which abrades a first area 1532 having a cloverleaf-like pattern such as seen in FIG. 15, in which the abraded area may be formed, for example, by four smaller abraded areas each having a circular shape.

Figure 16:
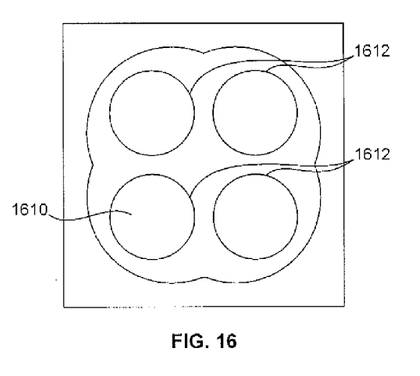
FIG. 16 is a plan view illustrating an encapsulated component, after removal of material therefrom in a method in accordance with a variation of the embodiment of the invention illustrated with respect to FIGS. 1A-C.

In another variation as seen in FIG. 16, it is possible for the encapsulated component to include multiple semiconductor wafers 1610. In some cases, the wafers may be smaller size wafers, e.g., four inch (100 mm) semiconductor wafers, which are held together such as described above, e.g., with a molded encapsulant extending between edges 1612 of the respective wafers.

Figure 17:
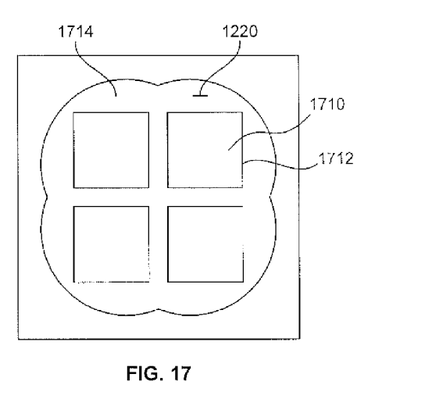
FIG. 17 is a plan view illustrating an encapsulated component, after removal of material therefrom in a method in accordance with a variation of the embodiment of the invention illustrated with respect to FIGS. 1A-C.

FIG. 17 illustrates versatility of the techniques described herein in which the encapsulated component contains a semiconductor chip, that is, at least one semiconductor chip 1710 (four being shown in FIG. 17) and an encapsulant extending in a direction parallel to an active surface of the at least one semiconductor chip outwardly from peripheral edges of such semiconductor chip.

Further variations and combinations of the examples shown herein can be made in accordance with the scope and spirit of the invention disclosed herein. The present application is intended to encompass all such variations and combinations of examples permitted by the disclosure herein.

What is claimed is:

1. A method of thinning an encapsulated component, comprising:
    abrading a first area of a first surface of an encapsulated component to reduce a thickness of the encapsulated component within the first area, the encapsulated component including:
        an undiced semiconductor wafer comprising a plurality of semiconductor chips each being an integral portion of the wafer, the wafer having a semiconductor region extending continuously within the plurality of semiconductor chips and an active wafer surface defined by active surfaces of each of the semiconductor chips, the active wafer surface facing away from the first surface, the wafer having an edge bounding the active wafer surface, wherein the active wafer surface comprises a semiconductor device region and a peripheral portion extending from the edge of the wafer to the semiconductor device region,
        a sacrificial structure overlying the semiconductor device region, and
        an encapsulant contacting the peripheral portion of the active wafer surface and extending outwardly in first and second directions beyond the edge of the wafer,
    wherein an entire area of the active wafer surface is aligned with the first area in the first and second directions,
    the abrading being performed such that after the abrading, a second area of the encapsulated component beyond the first area has a thickness greater than the reduced thickness, wherein the second area is configured to fully support the abraded encapsulated component in a state in which the encapsulated component is manipulated by handling equipment.

2. The method of claim 1, wherein the peripheral portion of the active wafer surface in contact with the encapsulant extends inwardly from the edge of the semiconductor wafer to a distance of at least 1.0 millimeters from the edge of the semiconductor wafer.

3. The method of claim 2, wherein the peripheral portion of the active wafer surface in contact with the encapsulant extends from an edge of the sacrificial structure.

4. The method of claim 1, wherein the reduced thickness of the encapsulated component is at least as great as a sum of the thickness of the semiconductor wafer after the abrading plus a thickness of the sacrificial structure overlying the semiconductor wafer.

5. The method of claim 1, wherein the second area of the encapsulated component is a continuous area surrounding the first area in the first and second directions.

6. The method of claim 1, wherein the second area of the encapsulated component is discontinuous within an area of the encapsulated component surrounding the first area in the first and second directions.

7. The method of claim 1, wherein the encapsulated component further comprises a support component, the encapsulant mechanically coupling the support component with the semiconductor chip.

8. The method of claim 7, wherein the support component is continuous and surrounds the first area in the first and second directions.

9. The method of claim 7, wherein the support component is discontinuous within an area surrounding the first area in the first and second directions.

10. The method of claim 7, wherein the support component comprises a solid metal.

11. The method of claim 1, further comprising, prior to the abrading of the encapsulated component, forming the encapsulated component by forming the sacrificial structure overlying the active wafer surface and then depositing the encapsulant over at least one edge and over at least a portion of a non-active surface of the undiced semiconductor wafer opposite from the active wafer surface, the sacrificial structure protecting the active wafer surface from contact with the encapsulant.

12. The method of claim 11, further comprising, after the abrading, removing at least a portion of the sacrificial structure.

13. The method of claim 1, further comprising severing the semiconductor chips from the wafer after the abrading step.

14. The method of claim 1, wherein the encapsulant extends beyond the active wafer surface in a direction away from the first surface such that the encapsulant within the first area has a thickness greater than the wafer after the abrading step.

15. The method of claim 1, wherein the encapsulant abuts and extends from an edge of the sacrificial —structure.

* * * * *